United States Patent [19]

Swanson

[11] Patent Number: 4,477,782
[45] Date of Patent: Oct. 16, 1984

[54] COMPOUND CURRENT MIRROR

[75] Inventor: Eric J. Swanson, Reading, Pa.

[73] Assignee: AT&T Bell Laboratories, Murray Hill, N.J.

[21] Appl. No.: 495,063

[22] Filed: May 13, 1983

[51] Int. Cl.³ .............................................. H03F 3/16
[52] U.S. Cl. .................................. 330/288; 330/277; 330/253; 330/257
[58] Field of Search ............... 330/253, 257, 277, 285, 330/288; 323/315, 316

[56] References Cited

U.S. PATENT DOCUMENTS 3,936,725  2/1976  Schneider .............................. 323/1
4,264,874  4/1981  Young .................................. 330/277

OTHER PUBLICATIONS

Black, et al., "Gyrator Implementation with Integrable Current Conveyors", IEEE J. Solid State Ckts., vol. SC-6, No. 6, pp. 396-399, Dec. 1979.
Young, Ian A., "A High Performance all Enhancement NMOS Op Amp", IEEE J. Solid State Ckts., vol. SC-14, No. 6, Dec. 1979, pp. 1070-1077.
"High Frequency CMOS Switched Capacitor Filters for Communications Applications", ISSCC Digest of Technical Papers, vol. 26, p. 246, 1983, Choi et al.

Primary Examiner—James B. Mullins
Assistant Examiner—Steven J. Mottola
Attorney, Agent, or Firm—Volker R. Ulbrich

[57] ABSTRACT

Two gate-coupled pairs (12, 14; 16, 18) of MOS transistors are configured in a compound current mirror (10, 30) arrangement. Each pair includes an input (12; 16) and an output (14; 18) transistor. The output transistors are connected with their conduction paths in series between a source of output current a reference voltage node (22). Each of the input transistors is connected with its conduction path between the reference voltage node (22) and a separate current source (20, 24), with both sources supplying the same input current. One of the input transistors (12, 60) has a conduction path width-to-length ratio which is one-fourth that of the other one (16). This makes it possible to bias the output transistors with the minimum ON voltage for operation in the active region and thereby reduces power supply voltage overhead.

A modified version (30) of the above arrangement includes, in addition, a transistor (32) for equalizing the drain-source voltage of the input and output transistors (16, 18) of an associated pair.

An operational amplifier circuit (34) is described which is particularly adapted for the use of a compound mirror arrangement of two input transistors (54, 60), two output transistors (50, 52), and an equalizing transistor (56) in its differential input stage.

15 Claims, 3 Drawing Figures

COMPOUND CURRENT MIRROR

FIELD OF THE INVENTION

The present invention relates generally to integrated electronic circuits, particularly those which use FET (field effect transistor) devices, and relates more particularly to a type of current amplifier commonly used in such circuits.

BACKGROUND OF THE INVENTION

A current mirror is a type of current amplifier which provides a high impedance output current proportional to an input current. The output current is typically used to drive a load for high gain. A simple mirror generally consists of a single input and a single output transistor pair, with the gate electrodes of the pair being tied together and to an input voltage node at the drain of the input transistor. The sources of the transistors are connected to a reference voltage node which is common to both. The drain and gate of the input transistor are connected to a current source which provides a quiescent reference current. Because the input and output transistors have their gates and sources tied together, a corresponding output current arises in the conduction path of the output transistor. Generally, the input and output transistors are identical and there is a substantially unity gain in the current. Such mirrors are commonly used to provide active loads in high gain amplifier stages.

There are presently two conflicting trends in the design of MOS circuits. One is a trend toward MOS (metal-oxide-silicon) devices with shorter conduction channel lengths for accommodating higher signal frequencies. The other is a trend toward lower supply voltages for reducing power consumption, so that more devices may be included in a single circuit, on a chip. The conflict arises in that as the devices of a current mirror have their channel lengths shortened, their transconductance rises, but their output conductance rises even faster. The resulting lower available current mirror output impedance has led to combined arrangements of two or more mirrors in which the output transistors are connected in series. These, however, require increased power supply voltage, or overhead, for obtaining increased output impedance because each of the output transistors requires sufficient drain-to-source voltage to be biased in saturation.

SUMMARY OF THE INVENTION

The novel arrangement in accordance with the present invention is a compound current mirror which includes at least two input and output transistor pairs. The input transistors have separate and equal conduction path currents but different conduction path geometries. The geometries of the input transistors are related to each other in such a manner that they result in gate bias voltages which optimize the drain-to-source voltages $V_{DS}$ of the output transistors. For a dual pair combination with MOS devices, one of the input transistors has a conduction channel width-to-length ratio W/L which is at least about four times that of the other input transistor device.

With both ouput transistors operating at their minimum required $V_{DS}$, it is possible to obtain a greater voltage swing from an output node for a given supply voltage.

DETAILED DESCRIPTION

EXAMPLE 1

Figure 1:
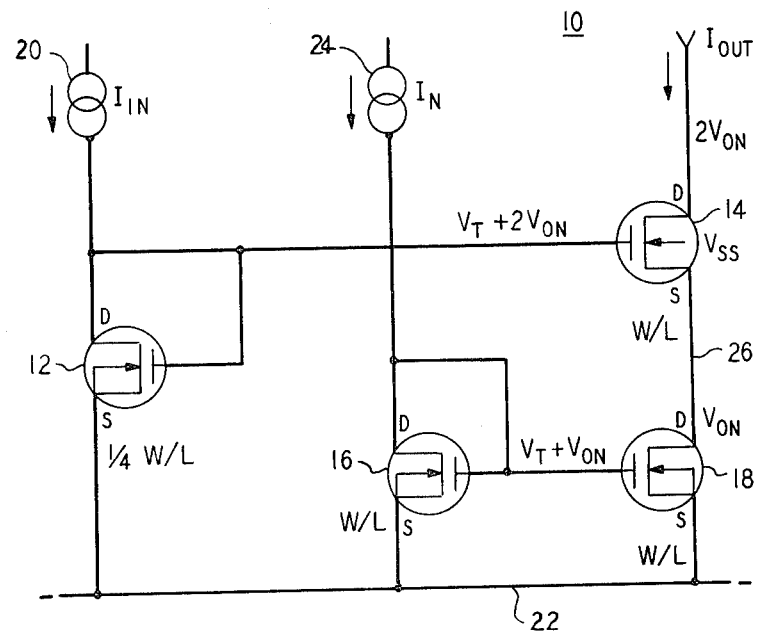
FIG. 1 is a schematic circuit diagram of a compound current mirror in accordance with the one embodiment of the present invention and including an upper and a lower input and output transistor pair.

The current mirror 10 shown in FIG. 1 of the drawings includes an upper input an ouput pair of transistors 12, 14 and a lower input and output pair of transistors 16, 18. All the transistors 12, 14, 16, 18 are N-channel MOS devices of the enhancement mode type. The upper transistors 12, 14 have their gates connected together and tied to the drain of the upper input transistor 12 to form a cascode arrangement. The lower transistors 16, 18 have their gates connected together and tied to the drain of the lower input transistor 16. The upper input transistor 12 has its conduction path connected between an upper input current source 20 and a reference node 22, while the lower input transistor 16 has its conduction path connected in series with a lower input current source 24 and the reference node 22. The output transistors 14, 16 have their conduction paths connected in series between the reference node 22 and an output node which is positive with respect to the voltage on the reference node 22. The input transistor 16 and both of the output transistors 14, 18 are substantially similar in their geometry and thus in their operational characteristics. In particular, they have the same conduction channel width-to-length ratio W/L. The upper input transistor 12, however, has a conduction channel ratio of ¼ (W/L). The width W of the conduction channel of an MOS transistor is the effective physical width of the source and the drain electrodes. The length L of the conduction channel of an MOS transistor is the shortest physical distance between the source and drain electrodes as taken along the conduction channel. As will be seen from discussion below, the ¼ W/L geometry of the upper input transistor 12 permits setting the quiescent state bias voltages of the gate nodes at levels which puts both the upper and lower output transistors 14, 18 in a saturated operating state.

The current sources 20, 24 are designed so that in the quiescent state equal reference currents $I_{ref}$ flow through the conduction paths of the input transistors 12, 16. Since MOS devices are "square law" devices, their drain current is related to their gate-source voltage by a polynomial expression which can be simplified by eliminating terms of practically insignificant magnitude so that it becomes $$I_D \alpha \frac{W}{L}(V_{GS} - V_T)^2, \qquad (1)$$

where $I_D$ is the drain-to-source current, or the conduction path current,

W/L is the channel width-to-length ratio, $V_{GS}$ is the gate-to-source voltage, and $V_T$ is the threshold voltage of the device.

This square law relationship applies to MOS devices only when biased in saturation; that is, devices for which $$V_{DS} > V_{GS} - V_T. \quad (2)$$

The amount by which a device's gate-to-source voltage $V_{GS}$ exceeds $V_T$ will be referred to as the on-voltage $V_{ON}$ of the device. For operation in saturation, then, $V_{DS} \geq V_{ON}$.

The reference current from the current source 24 and the W/L of transistor 16 establish:

$$I \alpha \frac{W}{L} (V_{ON} \text{ of transistor } 16)^2 = \frac{W}{L} (V_{ON})^2 \quad (3)$$

so that the quiescent state voltage at the drain and gate of the lower input transistor 16 is $V_T + V_{ON}$. It follows that the drain-to-source voltage under these conditions for the lower output transistor 18 must exceed $V_{ON}$. Proceeding in a like manner for the upper input transistor 12 leads to a gate voltage of $V_T + 2 V_{ON}$ for it. It follows that the upper output transistor 14 will be in saturation, provided its drain voltage exceeds only 2 $V_{ON}$. Thus it is seen that by virtue of the ¼ W/L geometry of the upper input transistor 12 with respect to the W/L geometry of the lower input transistor 16, the gate bias voltages of the mirrors are determined so that in the quiescent state both the output transistors 14, 18 can operate at their $V_{ON}$, which is just enough for saturation. This is a highly desirable condition, since it permits the voltage ouput for a double-to-single ended converter application to have a voltage swing to well within a threshold voltage $V_T$ of the voltage on the reference node 22.

EXAMPLE 2

Figure 2:
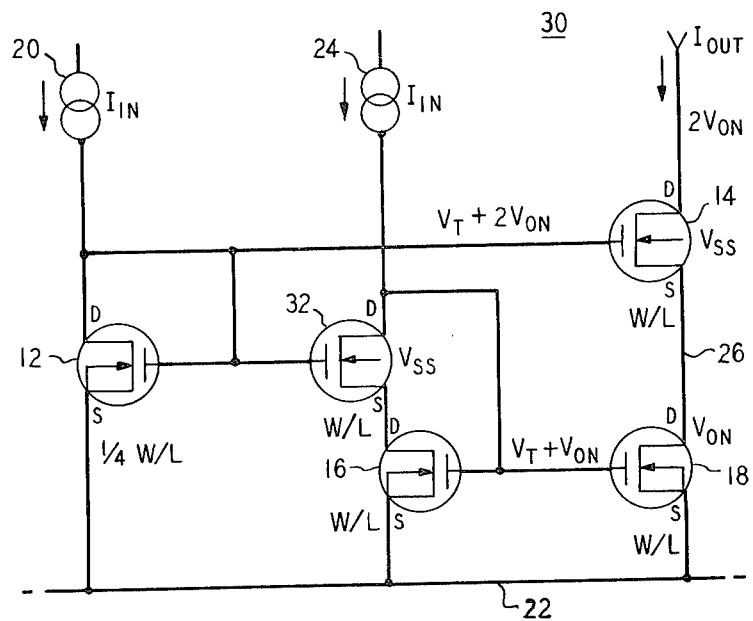
FIG. 2 is a schematic circuit diagram of a compound current mirror in accordance with another embodiment of the invention in the form of the mirror of FIG. 1 modified by the inclusion of an additional transistor for equalizing the transistor drain-source voltages of the lower transistor pair.

The FIG. 2 of the drawings is a schematic circuit diagram of a current mirror 30 which is a modified version of the mirror 10 of FIG. 1 and has corresponding elements identified by the same reference numerals. The mirror 30 includes in addition to the four transistors 12, 14, 16, 18 a fifth, equalizing transistor 32 connected between the drain of the lower input transistor 16 and the current source 24. The gate of the lower input transistor 16 is connected to the drain of this equalizing transistor 32. The equalizing transistor 32 has its gate connected to the gates of the upper input and output transistors 12, 14. Its presence assures that the $V_{DS}$ of the lower input transistor 16 will be equal to the $V_{DS}$ of the transistor 18, thereby substantially eliminating current offsets in the compound mirror 30.

EXAMPLE 3

Figure 3:
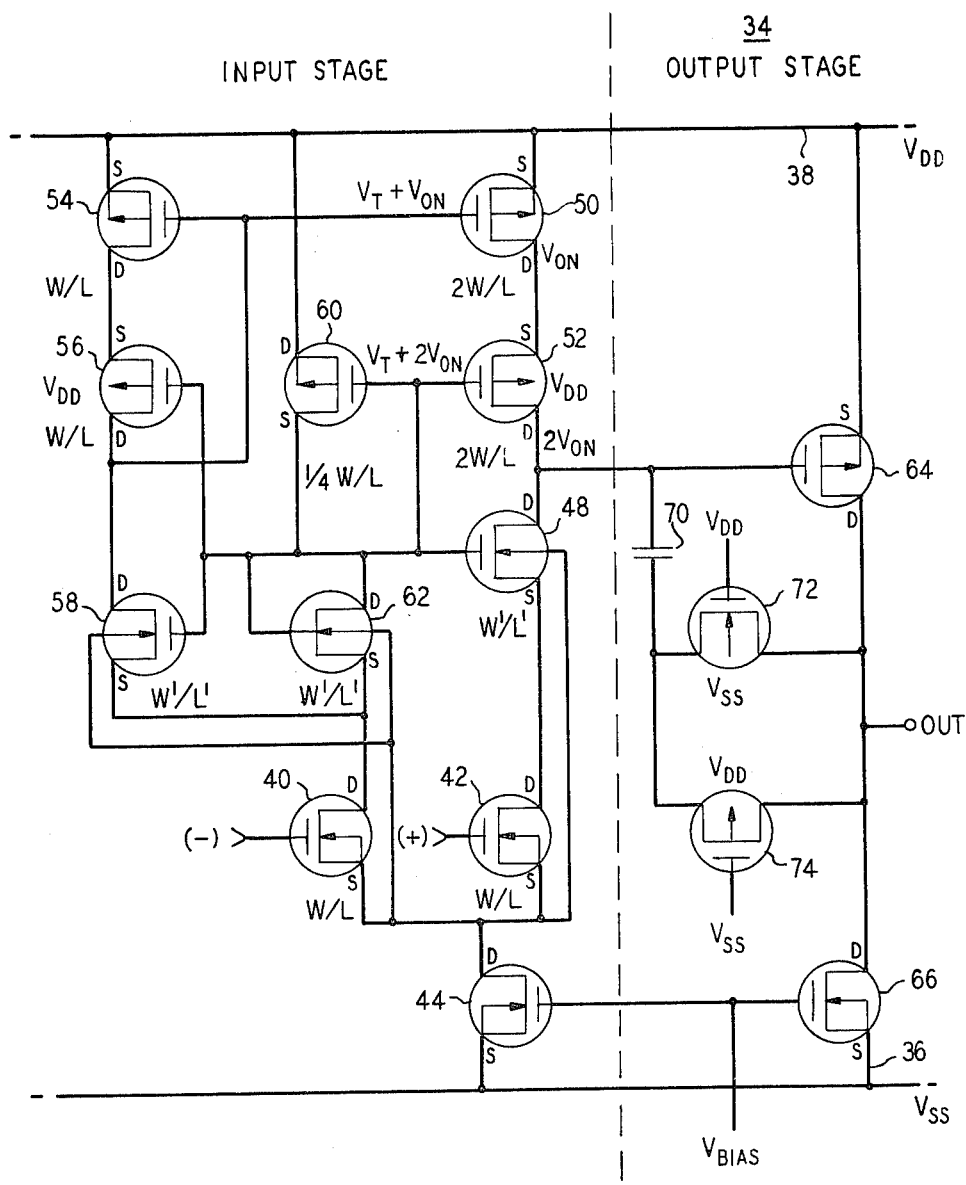
FIG. 3 is a schematic circuit diagram of a complementary MOS operational amplifier having a differential input stage which includes a compound current mirror in accordance with the invention.

In FIG. 3 of the drawings there is shown a CMOS (complementary MOS) operational amplifier 34 which includes a current mirror in accordance with the invention. The amplifier 34 has a negative supply voltage node 36 and a positive supply voltage node 38. All the transistors are enhancement mode MOS devices. An N-channel negative differential input transistor 40 and an N-channel positive differential input transistor 42 have their sources connected to the drain of a current source transistor 44 which has its own source connected to the negative supply voltage node 36. The gate of the current source transistor 44 is connected to a bias voltage $V_{bias}$. The gate of the negative input transistor 40 forms an inverting input port (−). The gate of the positive input transistor 42 forms a noninverting input port (+). The drain of the positive input transistor 42 is connected to the source of an isolating transistor 48. A P-channel compound current mirror provides an active load for the input stage of the amplifier 34. It is noted than this P-channel mirror has a configuration which appears inverted when compared to that of the N-channel transistor mirrors 10, 30 of FIG. 1 and FIG. 2 due to the opposite channel polarity of the devices. Two P-channel transistors 50, 52 have their conduction paths connected in series, respectively, between the positive supply voltage node 38, which here corresponds to a reference voltage node, and the drain of the isolating transistor 48. The gate of the transistor 50 is tied to the gate of a P-channel input transistor 54. The input transistor 54, a P-channel equalizing transistor 56, and an N-channel isolating transistor 58 are connected with their conduction paths in series, respectively, between the positive supply voltage node 38 and the drain of the negative input transistor 40 to form a first input current branch. An input transistor 60 and an N-channel diode-connected isolating transistor 62 have their conduction paths connected in series, respectively, between the positive supply voltage node 38 and the drain of the negative differential input transistor 40 to form the second input current branch. The drain of the equalizing transistor 56 is tied to the gates of the transistors 54, 50. The gates of the equalizing transistor 56 and the isolating transistors 48, 58, 62 are all tied to the gates of the transistors 60, 52.

The drain of the current mirror output transistor 52 forms an ouput node of the input stage of the amplifier 34 and is connected to the gate of a P-channel output transistor with an N-channel current source transistor 66, respectively, between the positive supply voltage node 38 and the negative supply voltage node 36. A capacitor 70 is connected between the gate of the output transistor 64 and to one side of a parallel pair of complementary resistor-connecred MOS devices 72, 74 which have their other side connected to the drains of the output transistors 64, 66. The capacitor 70 and the resistor devices 72, 74 together form a frequency compensation network. The drains of the output transistors 64, 66 are part of the output node of the amplifier 34.

The W/L rations of input transistor 54 and equalizing transistor 56 are the same. The width-to-length ratio $W^1/L^1$ of the isolating transistors 48, 58, 62 are related to each other, but not necessarily to the W/L of the transistors 50, 52, 54, 56, 60 of the mirror. Transistors 58, 62 divide the bias current equally into the two input branches of the compound mirror. Transistor 60, at ¼ the W/L of the transistors 54, sets up the bias level of the transistor 52, 56 at $V_T + 2 V_{ON}$ below the $V_{DD}$ rail. Transistors 50 and 52 are sized at 2 times the W/L of the transistor 54 to force the drain currents of transistors 40 and 42 to be nominally equal. Transistors 50, 54 are biased at the edge of saturation, allowing the high-gain region of the input stage to extend above $V_{DD} - V_T$. Greatly enhanced input stage voltage gain is combined with simple second stage design.

General Considerations

The compound mirror configurations 10 and 30 of FIGS. 1 and 2 are designed to have unity current gain in the interest of facilitating their descriptions by eliminating needless complexity. They could readily be modified in known ways analogous to those which apply to simple current mirrors to have a non-unity current gain. This is accomplished, in principle, by changing the relative width-to-length ratios of the input and output transistors of a given pair according to the desired gain. The mirror in the amplifier 34 of FIG. 3, for example, has twice the gain of the mirrors 10 and 30.

It will be apparent to those skilled in the art that any of the above-described circuits can be realized with transistors having a conduction channel of the conductivity type which is the opposite of that for the corresponding shown transistor by switching the power supply and reference voltage node polarities accordingly. Moreover, in either case the transistors may be of the enhancement mode type, the depletion mode type, or combinations of both types.

The invention can be realized with any "square-law" device, i.e., a device for which the conduction path current is proportional to the square of the minimum voltage $V_{ON}$ on the conduction path for establishing a saturation of majority carriers in it. Such devices include the various FET devices, particularly insulated gate FET's, such as MOS transistors. The various different N-channel and P-channel MOS devices, whether enhancement mode or depletion mode, can be configured either in unmixed or mixed configurations to form an arrangement in accordance with the invention. In general, therefore, the width-to-length ratio of the conduction channel of the larger ratio input transistor will be proportional to the width-to-length ratio of the conduction channels of the output transistors as the input reference current is proportional to the corresponding output current.

While in the above Examples 1, 2, and 3 there are only two current mirror output transistors present, more could be added as desired and associated with corresponding additional input branches, with input transistors having the appropriate W/L to bias their output transistor at $V_{DS}=V_{ON}$. For example, a third output transistor added to the mirror of FIG. 1 would have its conduction path connected between the source of the lower output transistor 18 and the reference node 22. An input transistor associated with it in a third input current branch would have a (1/9) W/L; an input transistor associated with a fourth output transistor would have a (1/16) W/L, and so on. As a practical matter, however, the use of three or more output transistors rapidly approaches a point of diminishing returns. The output voltage node can swing only as close to the supply voltages as the sum of the output transistor $V_{ON}$'s. Therefore, the benefits of low supply voltage operation are soon compromised by a combination which includes too many output transistors.

What is claimed is:

1. A current amplifying apparatus comprising: at least two output current transistors, each having a conduction path and a control electrode, the conduction paths being connected in series with each other;
    means for supplying output current in the current paths of said output transistors;
    bias voltage means including, in association with each of said output transistors, an input current transistor having a conduction path and a control electrode, the control electrode of each of said input transistors being coupled to a point of the input current path and to the control electrode of said output transistor associated therewith, and
    means for supplying an input current in the conduction paths of said input transistors,
    said input transistors being devices for which the conduction path current is substantially proportional to the square of the minimum required voltage along the conduction path for operation in the saturated mode, multiplied by a constant factor related to the physical geometry of said input transistors, and
    at least one of said input transistors having a geometry different from another of said input transistors, whereby for a given input current in their conduction paths, said one and said other input transistors generate different bias voltages on the control electrodes of the respective said output transistors associated with them.

2. The apparatus defined in claim 1 wherein said input transistors are field-effect transistors having a source, a gate, and a drain, and said constant factor is proportional to the ratio of the conduction path channel width to its length.

3. The apparatus defined in claim 2 wherein said one input transistor has a conduction channel width-to-length ratio of no more than about one fourth that of said other input transistor.

4. The apparatus defined in claim 3 wherein said input transistors have their conduction paths connected in parallel with each other and said means for generating an input current is adapted to generate an input current of equal magnitude in the conduction channel of each of said input transistors.

5. The apparatus defined in claim 4 wherein said output transistors are field-effect transistors having a source, a gate, and a drain.

6. The apparatus defined in claim 5 comprising an additional field-effect transistor having its conduction path connected between one side of the conduction path of said one input transistor and the point at which the gate of said one input transistor is connected to the input current path.

7. Electrical apparatus comprising:
    first and second transistor pairs, each including an input transistor and an output transistor, said transistors being square-law devices having a conduction path associated with electrodes defining a source, a drain, and a gate for controlling current in the conduction path;
    said input transistors each having their conduction path connected between a reference current means associated therewith and a supply voltage means;
    said output transistors having their conduction paths connected in series between an output node and said supply voltage means and
    the input and output transistors of each pair having a common gate connected to said reference current means associated therebetween, wherein the improvement comprises that
    one of said pairs comprises an input transistor having a width-to-length ratio substantially one fourth the width-to-length ratio of the other input transistor.

8. The apparatus defined in claim 7 wherein the width-to-length ratio of the conduction channel of the other input transistor is proportional to the width-tolength ratio of the conduction channel of said output transistors as the reference current is proportional to the corresponding output current.

9. The apparatus defined in claim 8 and comprising an equalizing transistor having a control electrode and having a conduction path with a width-to-length ratio substantially equal to that of said other input transistor and connected in series between the conduction path of the one input transistor and the said reference current means, the control electrode of said one input transistor being connected to said equalizing transistor conduction path side remote from said one input transistor, and the control electrode of said equalizing transistor being coupled to the control electrode of the other said input transistor.

10. A field-effect transistor signal converting circuit, comprising first and second differential input transistors having their gates adapted as input ports and their sources connected to a current source;
   a first input current branch including an input transistor, an equalizing transistor, and an isolating transistor having their conduction paths connected in series, respectively, between a supply voltage node and the drain of said first differential input transistor;
   a second input current branch including an input transistor and an isolating transistor having their conduction paths connected in series, respectively between the supply voltage node and the drain of said first differential input transistor, and
   an output current branch including first and second output transistors and an isolating transistor having their conduction paths connected in series, respectively, between the supply voltage node and the drain of said second differential input transistor,
   the gates of said first input branch input transistor and said first output transistor being tied together and to the drain of said equalizing transistor,
   the gates of said equalizing transistor, said isolating transistors, said second input branch input transistor, and said second output transistor all being tied together and to the drain of said second input branch input transistor,
   the bulk regions of said isolating transistors being connected to the sources of said differential input transistors,
   said first input branch input transistor having a conduction channel width-to-length ratio at least about four times that of said second input branch input transistor.

11. The circuit defined in claim 10 wherein said isolating transistor of said first input branch and said isolating transistor of said second input branch have substantially equal conduction channel width-to-length ratios.

12. The circuit defined in claim 11 wherein the conduction channel width-to-length ratios of said output transistors are substantially equal.

13. The circuit defined in claim 12 wherein the conduction-channel widths of said output transistors are about two times as great as that of said first input branch input transistor.

14. The circuit defined in claim 13 wherein said equalizing, said input current branch input, and said output transistors have conduction channels of one conductivity type and said isolating and differential input transistors have conduction channels of another conductivity type.

15. The circuit defined in claim 13 comprising an output stage connected to the drain of said second output transistor.

* * * * *

UNITED STATES PATENT AND TRADEMARK OFFICE
CERTIFICATE OF CORRECTION

PATENT NO.  : 4,477,782
DATED       : October 16, 1984
INVENTOR(S) : Eric J. Swanson It is certified that error appears in the above-identified patent and that said Letters Patent is hereby corrected as shown below:

Column 1, line 30, "commony" should read --commonly--. Column 4, line 40, after "transistor" (1st occurr.) insert--64 which has its conduction path connected in series--; line 52, "rations" should read--ratios--.

Signed and Sealed this

*Twenty-fifth* Day of *June 1985*

[SEAL]

*Attest:*

DONALD J. QUIGG

*Attesting Officer*   *Acting Commissioner of Patents and Trademarks*